United States Patent
Li et al.

(10) Patent No.: US 12,284,900 B2
(45) Date of Patent: Apr. 22, 2025

(54) PACKAGING METHOD OF DISPLAY PANEL, DISPLAY PANEL AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Peng Li, Beijing (CN); Xinwei Gao, Beijing (CN); Dandan Zang, Beijing (CN); Qihe Chen, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 401 days.

(21) Appl. No.: 17/779,805

(22) PCT Filed: Apr. 13, 2021

(86) PCT No.: PCT/CN2021/086788
§ 371 (c)(1),
(2) Date: May 25, 2022

(87) PCT Pub. No.: WO2021/208876
PCT Pub. Date: Oct. 21, 2021

(65) Prior Publication Data
US 2022/0407031 A1    Dec. 22, 2022

(30) Foreign Application Priority Data
Apr. 16, 2020  (CN) .......................... 202010300473.9

(51) Int. Cl.
*H10K 59/80* (2023.01)
*H10K 50/842* (2023.01)
*H10K 71/00* (2023.01)

(52) U.S. Cl.
CPC ....... *H10K 59/872* (2023.02); *H10K 50/8426* (2023.02); *H10K 59/8722* (2023.02); *H10K 71/00* (2023.02); *H10K 71/851* (2023.02)

(58) Field of Classification Search
CPC .. H10K 50/8426; H10K 71/00; H10K 71/851; H10K 59/8722; H10K 59/872
See application file for complete search history.

(56) References Cited

U.S. PATENT DOCUMENTS

| | | | |
|---|---|---|---|
| 10,388,908 B1 * | 8/2019 | Yu | ............... H10K 71/00 |
| 2007/0205976 A1 * | 9/2007 | Takatori | ............... G09G 3/20 |
| | | | 345/100 |

(Continued)

FOREIGN PATENT DOCUMENTS

| CN | 101867024 | * | 10/2010 | ............. H01L 51/56 |
|---|---|---|---|---|
| CN | 101867024 A | | 10/2010 | |

(Continued)

OTHER PUBLICATIONS

The First Office Action for the Chinese Patent Application No. 202010300473.9 issued by the Chinese Patent Office on Jan. 27, 2022.

(Continued)

*Primary Examiner* — Galina G Yushina
(74) *Attorney, Agent, or Firm* — XSENSUS LLP

(57) ABSTRACT

A packaging method of a display panel, the packaging method including: defining, on a cover plate, at least one adhesive coating region that each is to cover a respective target specially-shaped pattern and have a regular shape; forming a packaging adhesive in the at least one adhesive coating region; bonding the cover plate formed with the packaging adhesive with a substrate formed with at least one target specially-shaped pattern, so that a display region of each target specially-shaped pattern is located within a respective adhesive coating region; and cutting the substrate (Continued)

and the cover plate that have been bonded according to the target specially-shaped pattern to obtain the display panel.

17 Claims, 9 Drawing Sheets

(56) References Cited

U.S. PATENT DOCUMENTS

| | | | |
|---|---|---|---|
| 2008/0048934 A1* | 2/2008 | Yamamoto | G09G 3/3611 345/55 |
| 2016/0293886 A1 | 10/2016 | Yu et al. | |
| 2019/0157624 A1 | 5/2019 | Zeng | |
| 2019/0310500 A1* | 10/2019 | Yamada | G02F 1/1339 |
| 2021/0043872 A1 | 2/2021 | Gao | |
| 2021/0351372 A1 | 11/2021 | Luo | |
| 2021/0408447 A1 | 12/2021 | Luo | |

FOREIGN PATENT DOCUMENTS

| | | | |
|---|---|---|---|
| CN | 104124268 A | 10/2014 | |
| CN | 105632339 A | 6/2016 | |
| CN | 106647067 | * 5/2017 | G02F 1/1345 |
| CN | 106953028 A | 7/2017 | |
| CN | 207909878 U | 9/2018 | |
| CN | 109256049 A | 1/2019 | |
| CN | 110098350 A | 8/2019 | |
| CN | 110112323 A | 8/2019 | |
| CN | 110211999 A | 9/2019 | |
| CN | 110429207 A | 11/2019 | |
| CN | 111477770 A | 7/2020 | |
| KR | 100671644 B1 | 1/2007 | |

OTHER PUBLICATIONS

The Second Office Action for the Chinese Patent Application No. 202010300473.9 issued by the Chinese Patent Office on Jun. 29, 2022.

The Third Office Action for the Chinese Patent Application No. 202010300473.9 Issued by the Chinese Patent Office on Sep. 15, 2022.

* cited by examiner

PACKAGING METHOD OF DISPLAY PANEL, DISPLAY PANEL AND DISPLAY APPARATUS

CROSS-REFERENCE TO RELATED APPLICATIONS

This application is a national phase entry under 35 USC 371 of International Patent Application No. PCT/CN2021/086788, filed on Apr. 13, 2021, which claims priority to Chinese Patent Application No. 202010300473.9, filed on Apr. 16, 2020, which are incorporated herein by reference in their entirety.

TECHNICAL FIELD

The present disclosure relates to the field of display technologies, and in particular, to a packaging method of display panel, a display panel and a display apparatus.

BACKGROUND

Organic light-emitting diodes (abbreviated as OLEDs) have been widely used in the field of display technologies due to their advantages of self-luminescence, quick response, wide viewing angle, high brightness, continuously adjustable emission color, low driving voltage, low energy consumption, lightness and thinness, etc.

SUMMARY

In an aspect, a packaging method of a display panel is provided. The packaging method includes: defining, on a cover plate, at least one adhesive coating region that each is to cover a respective target specially-shaped pattern and has a regular shape; forming a packaging adhesive on the at least one adhesive coating region; bonding the cover plate formed with the packaging adhesive with a substrate formed with at least one target specially-shaped pattern, so that a display region of each target specially-shaped pattern is within a respective adhesive coating region; and cutting the substrate and the cover plate that have been bonded according to the respective target specially-shaped pattern to obtain the display panel.

In some embodiments, the packaging adhesive includes a first packaging adhesive and a second packaging adhesive. Forming the packaging adhesive on the at least one adhesive coating region, includes: coating the first packaging adhesive on a peripheral region of each adhesive coating region to form a closed and regular-shaped first packaging portion; and filling the second packaging adhesive on a region surrounded by the first packaging portion to form a second packaging portion. A viscosity of the second packaging adhesive is lower than a viscosity of the first packaging adhesive.

In some embodiments, coating the first packaging adhesive on the peripheral region of the adhesive coating region to form the closed and regular-shaped first packaging portion, includes: coating the first packaging adhesive on the peripheral region of the adhesive coating region to form a frame-shaped first packaging portion.

In some embodiments, bonding the cover plate formed with the packaging adhesive with the substrate formed with the at least one target specially-shaped pattern, so that the display region of the target specially-shaped pattern is within the respective adhesive coating region, includes: bonding the cover plate formed with the packaging adhesive to the substrate formed with the at least one target specially-shaped pattern, so that the display region is located in a region where the second packaging portion is located.

In some embodiments, a region of the substrate on which the target specially-shaped pattern is formed includes at least one bonding region disposed on at least one side of the display region. Bonding the cover plate formed with the packaging adhesive with the substrate formed with the at least one target specially-shaped pattern, so that the display region of the target specially-shaped pattern is within the respective adhesive coating region, includes: bonding the cover plate formed with the packaging adhesive with the substrate formed with the at least one target specially-shaped pattern, so that the display region of the target specially-shaped pattern is within the respective adhesive coating region and the at least one bonding region is located adjacent to at least one side of the first packaging adhesive portion away from the second packaging adhesive.

In some embodiments, a region of the substrate on which the respective target specially-shaped pattern is formed includes at least one bonding region disposed on at least one side of the display region. Defining, on the cover plate, the at least one adhesive coating region that each is to cover the respective target specially-shaped pattern and has the regular shape, includes: defining, on the cover plate, at least one adhesive coating region that each is to cover a portion of the respective target specially-shaped pattern except for the at least one bonding region and has a regular shape.

In some embodiments, defining, on the cover plate, the at least one adhesive coating region that each is to cover the portion of the respective target specially-shaped pattern except for the at least one bonding region and has the regular shape, includes: defining, on the cover plate, the at least one adhesive coating region covering the portion of the respective target specially-shaped pattern, except for the at least one bonding region, the at least one adhesive coating region having a rectangular shape and a minimum area.

In some embodiments, before bonding the cover plate formed with the packaging adhesive with the substrate formed with the at least one target specially-shaped pattern, the packaging method further includes: curing the packaging adhesive.

In some embodiments, cutting the substrate and the cover plate that have been bonded according to the respective target specially-shaped pattern to obtain the display panel, includes: cutting the substrate and the cover plate that have been bonded for a first time according to a region corresponding to both the adhesive coating region and the respective target specially-shaped pattern, so as to form a semi-finished display panel having a regular shape; and removing portions of the substrate, portions of the packaging adhesive and portions of the cover plate of the semi-finished display panel that are all located outside a region corresponding to the respective target specially-shaped pattern through cutting and/or edge grinding process, so that the display panel is obtained.

In some embodiments, after cutting the substrate and the cover plate that have been bonded according to the respective target specially-shaped pattern to obtain the display panel, the packaging method further includes: coating a sealant on the edges of the display panel to complete packaging of the display panel.

In another aspect, a display panel is provided, the display panel includes a specially-shaped substrate, a specially-shaped cover plate, and an adhesive layer. The specially-shaped substrate has a display region. The specially-shaped cover plate has approximately same shape and dimensions as the specially-shaped substrate. The adhesive layer is located between the specially-shaped substrate and the specially-shaped cover plate and covers at least the display region.

In some embodiments, the adhesive layer includes a second packaging adhesive and at least one portion of a first packaging adhesive. The second packaging adhesive covers the display region, and the at least one portion of the first packaging adhesive is disposed adjacent to at least one side of the second packaging adhesive. A viscosity of the at least one portion of the first packaging adhesive is higher than a viscosity of the second packaging adhesive.

In some embodiments, the at least one bonding region and the at least one portion of the first packaging adhesive are equal in number.

In some embodiments, the display panel further includes a sealant disposed on edges of both the specially-shaped substrate and the specially-shaped cover plate.

In yet another aspect, a display apparatus is provided. The display apparatus includes the display panel as described in any of the above embodiments.

In some embodiments, the specially-shaped substrate has at least one bonding region disposed adjacent to at least one side of the display region, a bonding region of the at least one bonding region is located adjacent to a side of a portion of the first packaging adhesive away from the second packaging adhesive.

In some embodiments, the at least one portion of the first packaging adhesive each is connected to the second packaging adhesive.

In some embodiments, the display region is in a heart shape.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
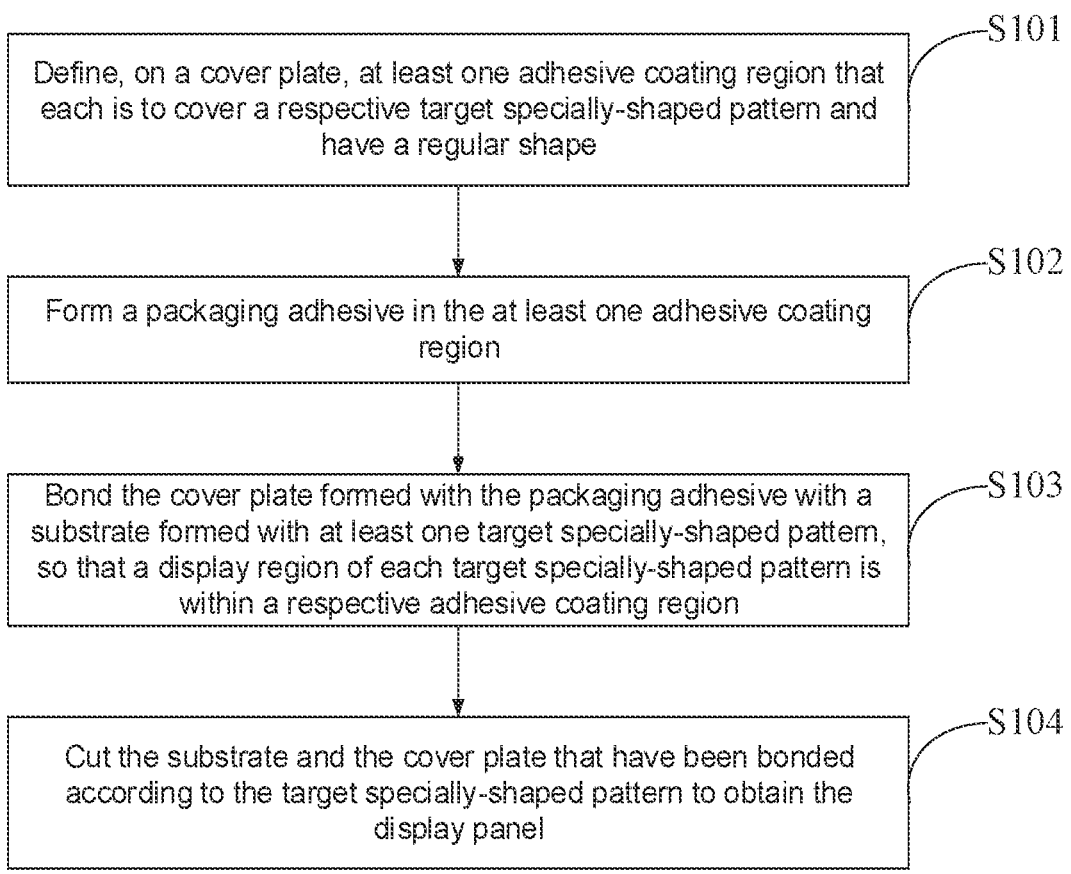
FIG. 1 is a flow diagram of a packaging method of a display panel, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive sense, i.e., "including, but not limited to". In the description of the specification, the terms such as "one embodiment", "some embodiments", "exemplary embodiments", "example", "specific example" and "some examples" are intended to indicate that specific features, structures or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, features defined as the terms such as "first" and "second" may explicitly or implicitly include one or more of the features. In the description of the embodiments of the present disclosure, the terms "a plurality of", "the plurality of" and "multiple" each mean two or more unless otherwise specified.

In the description of some embodiments, terms such as "coupled" and "connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact with each other. The term "coupled" or "communicatively coupled", however, may also mean that two or more components are not in direct contact with each other, but still cooperate or interact with each other. The embodiments disclosed herein are not necessarily limited to the content herein.

The phrase "A and/or B" includes the following three combinations: only A, only B, and a combination of A and B.

The use of the phase "applicable to" or "configured to" herein indicates an open and inclusive expression, which does not exclude devices that are applicable to or configured to perform additional tasks or steps.

As used herein, the term "if", depending on the context, is optionally construed as "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

In addition, the use of the phase "based on" is meant to be open and inclusive, since a process, step, calculation or other action that is "based on" one or more of the stated conditions or values may, in practice, be based on additional conditions or value beyond those stated.

The term "about" or "approximately" as used herein includes a stated value and an average value within an acceptable range of deviation of a particular value. The acceptable range of deviation is determined by a person of ordinary skill in the art in view of the measurement in questions and errors associated with the measurement of a particular quantity (i.e., limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown as a rectangle generally has a feature of being curved. Therefore, the regions shown in the accompanying drawings are schematic in nature, and shapes thereof are not intended to show actual shapes of the regions in a device, and are not intended to limit the scope of the exemplary embodiments.

With the development of organic light-emitting diode (OLED) products, there is a large demand for specially-shaped OLED display panel products (e.g., wearable display panel products, such as smart watches and smart glasses) in the market.

In the related art, during packaging of a specially-shaped OLED display panel, an adhesive is generally coated according to a shape of the display panel. However, due to a dispensing equipment and a peripheral design of the specially-shaped OLED display panel, a display region of the specially-shaped display panel is difficult to be covered with the adhesive completely. For example, in a process of dispensing the adhesive by the dispensing equipment based on a back and forth motion, if the specially-shaped display panel has arc-shaped edge(s), the arc-shaped edge(s) of the specially-shaped OLED display panel are prone to a problem that the adhesive is difficult to be coated or the adhesive is unevenly coated. For a top-emission OLED display panel, since there are both a filled region in which the adhesive is coated and an unfilled region in which no adhesive is coated in the display region, it may easily lead to differences in display brightness and color, resulting in uneven display. In addition, it is also easy to cause uneven cell thickness of the display panel due to the uneven coated adhesive, so that a portion of glass on the edge(s) is easily broken due to uneven force when a cutting or edge grinding process is performed, which affects quality of the display panel, and even leads to scrap, thus affecting a product yield.

Based on this, some embodiments of the present disclosure provide a packaging method of a display panel. As shown in FIG. 1, the method includes steps S101 to S104.

Figure 4:
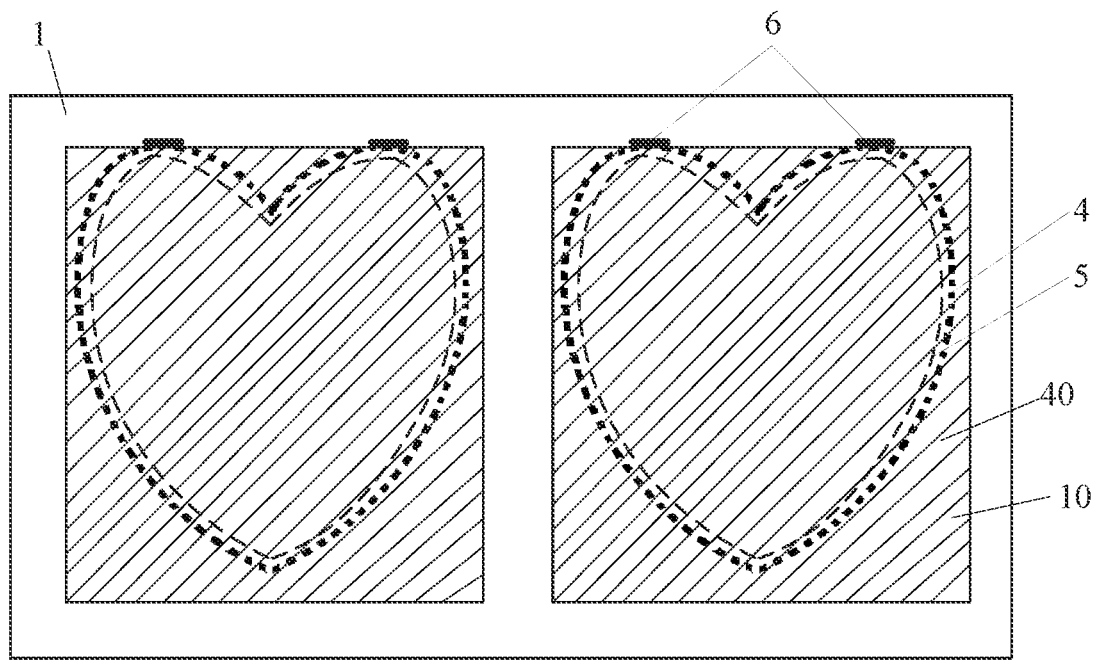
FIG. 4 is a structural diagram of a cover plate defined thereon with adhesive coating regions that each cover a target specially-shaped pattern and has a regular shape, in accordance with some embodiments.
Figure 9:
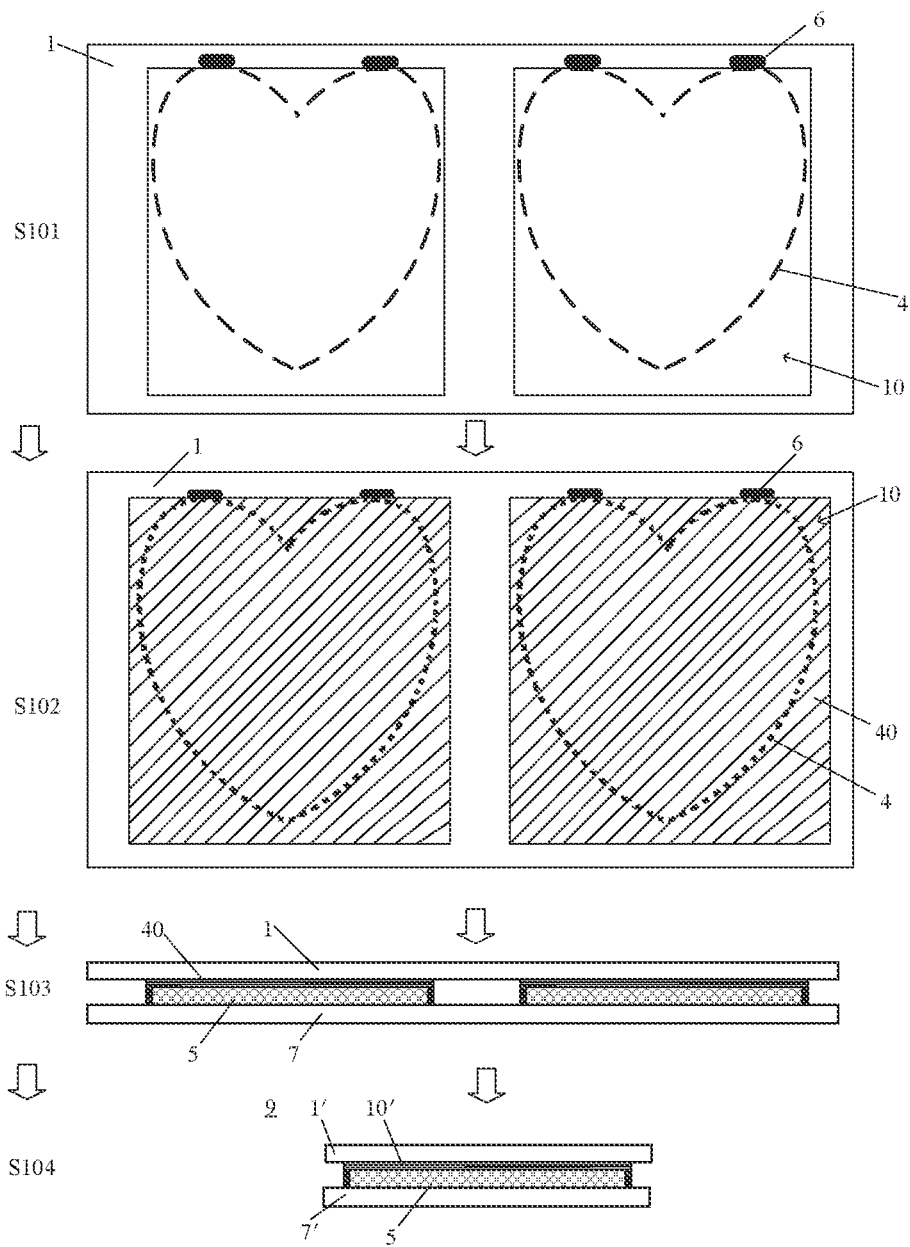
FIG. 9 is a process diagram of a packaging method of a display panel, in accordance with some embodiments.

Referring to FIGS. 4 and 9, in S101, adhesive coating region(s) 10, each of which is to cover a respective target specially-shaped pattern 4 and has a regular shape, are defined on a cover plate 1.

The target specially-shaped pattern 4 may be a preset pattern with a specially-shaped shape that the display panel 9 has.

With continued reference to FIGS. 4 and 9, in S102, a packaging adhesive 40 is formed in the adhesive coating region(s) 10.

Figure 3A:
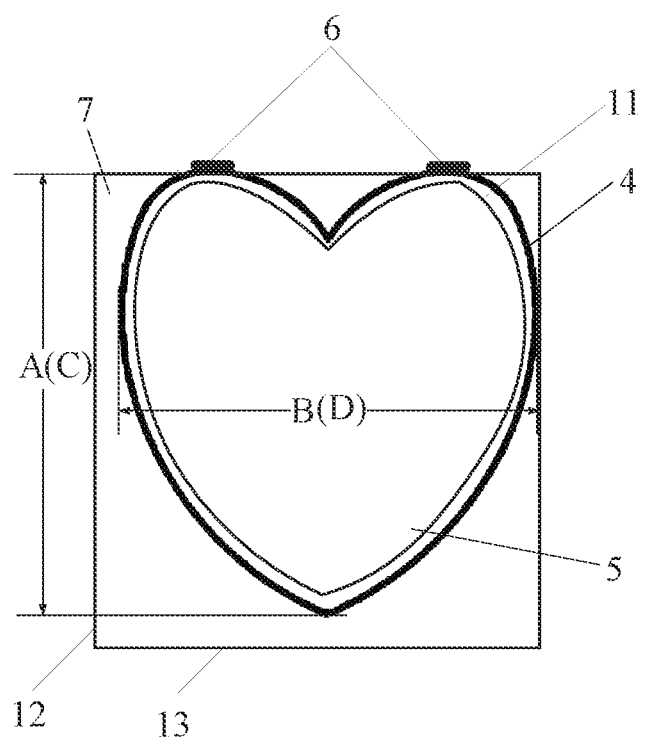
FIG. 3A is a structural diagram of a substrate provided thereon with a target specially-shaped pattern, in accordance with some embodiments.

Referring to FIGS. 3A, 4, and 9, in S103, the cover plate 1 formed with the packaging adhesive 40 is bonded to a substrate 7 formed with target specially-shaped pattern(s) 4, so that a display region 5 of each target specially-shaped pattern 4 is within a respective adhesive coating region 10.

Referring to FIGS. 3A, 4, 6 and 9, in S104, the substrate 7 and the cover plate 1 that have been bonded are cut according to the target specially-shaped pattern 4 to obtain the display panel 9.

In some examples, the cover plate 1 may be, for example, a glass cover plate. For example, the substrate 7 may be made of quartz, glass or the like.

Since the display panel 9 is obtained through cutting according to the target specially-shaped pattern 4, the display panel 9 has the same or approximately the same shape as the target specially-shaped pattern 4. For convenience of description, the display panel 9 obtained through cutting according to the target specially-shaped pattern 4 will be referred to as a specially-shaped display panel hereinafter.

The specially-shaped display panel has a shape different from a rectangle. For example, the specially-shaped display panel may be a display panel having a shape of a heart, a five-pointed star, a cloud, or the like.

In some examples, as shown in FIG. 3A, the shape and dimensions of the specially-shaped display panel are the same or approximately the same as the shape and dimensions of the target specially-shaped pattern 4, respectively. For example, in an implementation process of the method, according to the shape and dimensions of the specially-shaped display panel to be formed, a pattern whose shape and dimensions are approximately the same as the shape and dimensions of the specially-shaped display panel respectively may be formed on the substrate 7 in advance. The pattern formed on the substrate 7 may be referred to as the target specially-shaped pattern 4.

For formation of the target specially-shaped pattern, for example, structures such as light-emitting layers and circuit structures may be provided on the substrate in advance according to the designed specially-shaped shape and positions of the structures. For example, the light-emitting layers may be located in the display region, and the circuit structures may be disposed on the edge(s) of the display region. In this way, the target specially-shaped pattern is formed on the substrate. After the substrate and the cover plate are bonded, the specially-shaped display panel corresponding to the target specially-shaped pattern may be obtained through cutting according to the target specially-shaped pattern.

In some examples, the adhesive coating region having a regular shape refers to a region that has a regular shape and in which an adhesive may be coated later. The regular shape is a closed figure that is bounded by a plurality of line segments sequentially connected and in which the adhesive may be coated later. In addition, an included angle between any two adjacent line segments of the closed figure is about 90 degrees. For example, the regular shape may be a rectangle, a square or other shape. In this way, it may effectively avoid a problem that a periphery of the adhesive coating region is difficult to be coated with the adhesive during a process of dispensing the adhesive by the dispensing equipment forth and back, which helps to form a good coating effect in the adhesive coating region, and further improves a display effect and product yield of the display panel.

In addition, the packaging adhesive may be an ultra violet (UV) curable adhesive or a thermally curable adhesive, and a material thereof may be resin, a photoinitiator, a curing agent, or the like, which is not specifically limited in the embodiments of the present disclosure.

In some embodiments of the present disclosure, since the adhesive coating region covers the target specially-shaped pattern and has the regular shape, no matter what shape the target specially-shaped pattern has, the adhesive may be coated according to the regular shape of the adhesive coating region, and a region of the cover plate corresponding to the target specially-shaped pattern may be well coated with the adhesive. In this way, in a case where the cover plate is bonded to the substrate and the display region of the target specially-shaped pattern is within the adhesive coating region, the display region may also be completely coated with the adhesive. Then, the substrate and the cover plate that have been bonded are cut according to the target specially-shaped pattern, so that a corresponding specially-shaped display panel may be obtained.

The packaging method provided in some embodiments of the present disclosure may be applied to packaging of specially-shaped display panels of different shapes and dimensions. In addition, it may effectively avoid an adhesive coating process in packaging technologies from being affected and restricted by the dispensing equipment and the shape, dimensions and peripheral design of the specially-shaped display panel, so that the display region of the target specially-shaped pattern may be coated with the adhesive evenly and sufficiently after the substrate and the cover plate are bonded. In this way, it may help to ameliorate the differences in display brightness and color of the display panel caused by uneven adhesive that is coated in the display region. Moreover, since the adhesive is evenly coated in the display region, it helps to maintain a uniform cell thickness of the specially-shaped display panel, which may effectively avoid cracks on the edge(s) of the substrate and/or cover plate in a cutting process, thereby helping to improve the quality and product yield of the specially-shaped display panel. In addition, the adhesive coating process in the embodiments of the present disclosure is relatively simple, which also helps to improve the adhesive coating efficiency of the specially-shaped display panel.

Figure 2:
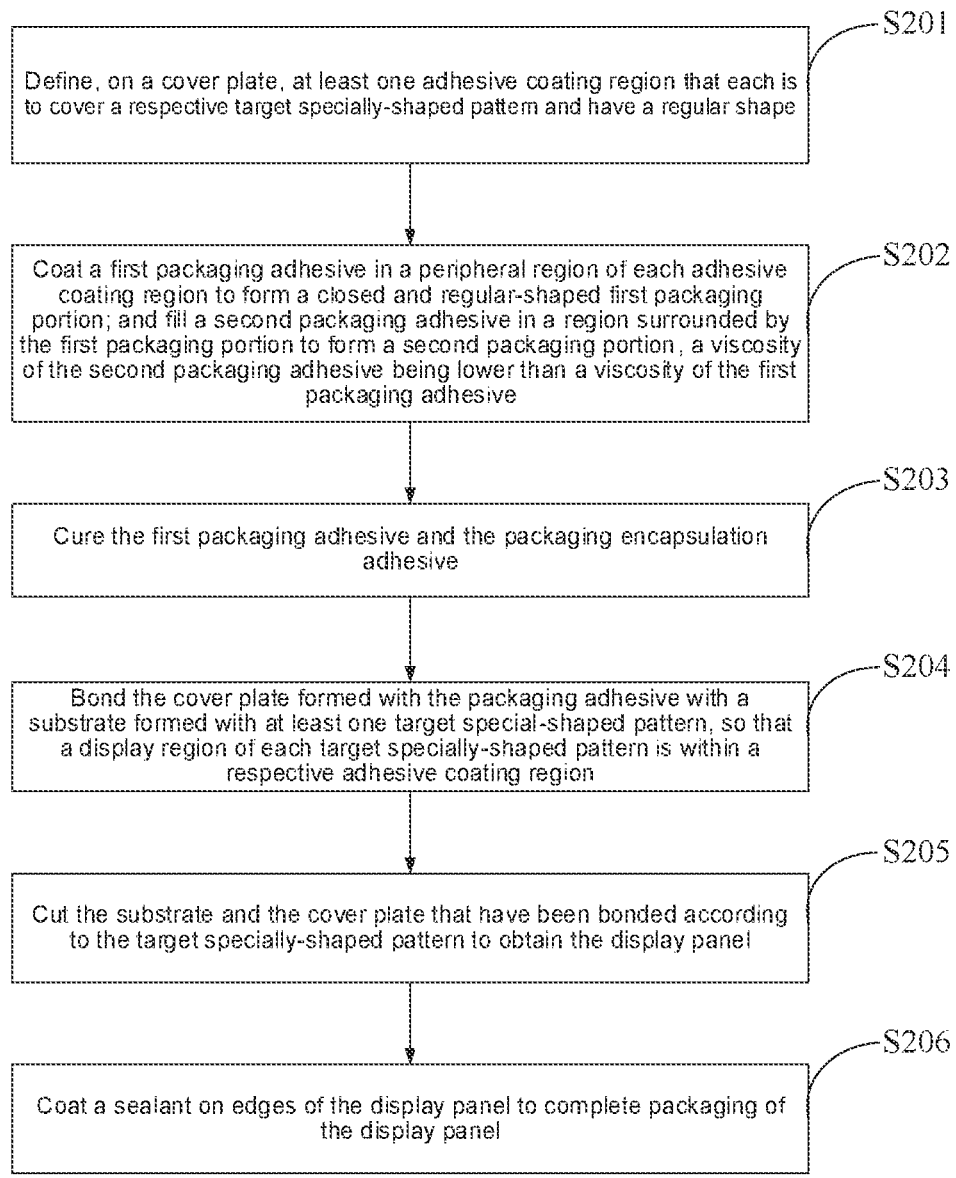
FIG. 2 is a flow diagram of another packaging method of a display panel, in accordance with some embodiments.

In some embodiments of the present disclosure, as shown in FIG. 2, the packaging method includes steps S201 to S206.

Figure 10:
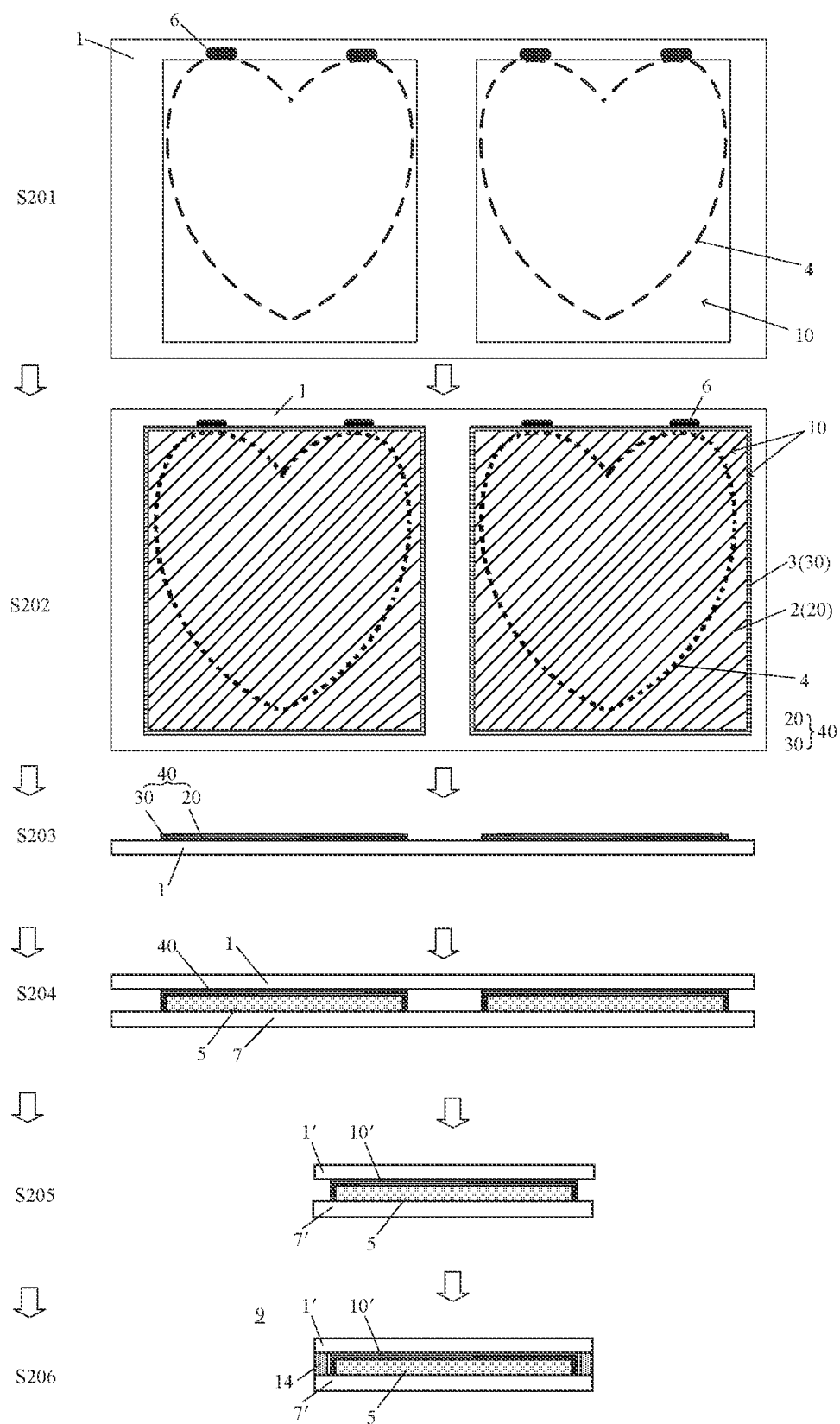
FIG. 10 is a process diagram of another packaging method of a display panel, in accordance with some embodiments.

Referring to FIGS. 4 and 10, in S201, the adhesive coating region(s) 10, each of which is to cover the respective target specially-shaped pattern 4 and has the regular shape, is defined on the cover plate 1.

With continued reference to FIGS. 4 and 10, in S202, a first packaging adhesive 30 is coated in a peripheral region of each adhesive coating region 10, so that a closed and regular-shaped first packaging portion 3 is formed; and a second packaging adhesive 20 is filled in a region surrounded by the first packaging portion 3, so that a second packaging portion 2 is formed. A viscosity of the second packaging adhesive 20 is lower than a viscosity of the first packaging adhesive 30.

Referring to FIG. 10, in S203, the packaging adhesive 40 is cured. In a case where the packaging adhesive 40 includes the first packaging adhesive 30 and the second packaging adhesive 20, the first packaging adhesive 30 and the second packaging adhesive 20 are cured.

Referring to FIGS. 3A, 4 and 10, in S204, the cover plate 1 is bonded to the substrate 7 formed with the target specially-shaped pattern(s) 4, so that the display region 5 of the target specially-shaped pattern 4 is within the adhesive coating region 10.

Referring to FIGS. 3A, 4, 6 and 10, in S205, the substrate 7 and the cover plate 1 that have been bonded are cut according to the target specially-shaped pattern 4, so that the display panel 9 is obtained.

Figure 7:
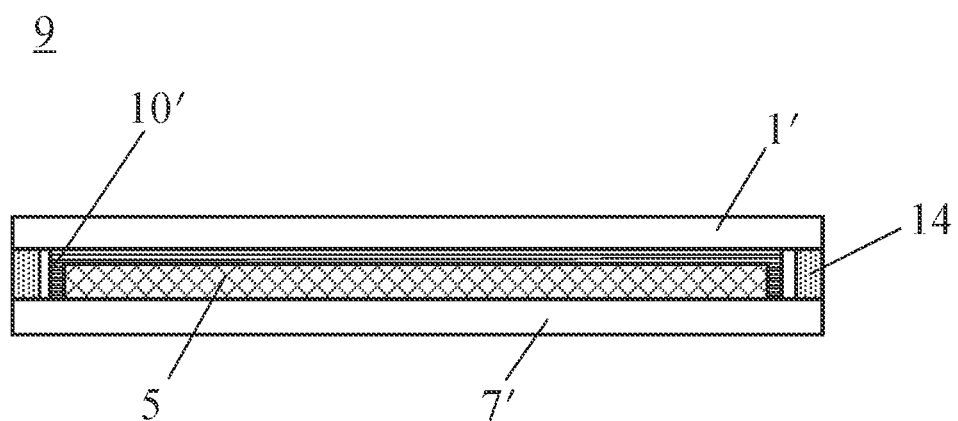
FIG. 7 is a structural diagram of a display panel formed after a sealant is coated, in accordance with some embodiments.

Referring to FIGS. 7 and 10, in S206, a sealant 14 is coated on edges of the display panel 9, so that packaging of the display panel 9 is completed.

As shown in FIG. 3A, the target specially-shaped pattern 4 is pre-formed on the substrate 7, and the target specially-shaped pattern 4 may be obtained by arranging structures such as the light-emitting layers and the circuit structures as a whole into a designed specially-shaped shape on the substrate 7. In this way, when the substrate 7 and the cover plate 1 that have been bonded are cut according to the target specially-shaped pattern 4, a corresponding specially-shaped shape may be obtained, and then the specially-shaped display panel may be formed.

In order to clearly understand some embodiments of the present disclosure and implementation processes thereof, some embodiments of the present disclosure will be described in detail below by taking an example where the target specially-shaped pattern 4 is in a heart shape.

Figure 3B:
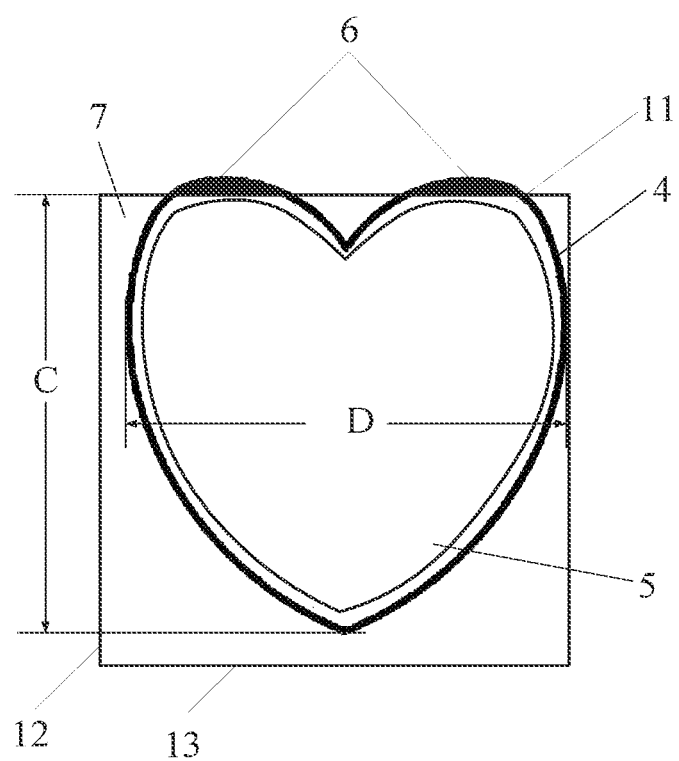
FIG. 3B is a structural diagram of another substrate provided thereon with a target specially-shaped pattern, in accordance with some embodiments.

In some embodiments of the present disclosure, referring to FIGS. 3A and 3B, the specially-shaped display panel is set to be in the heart shape, and then the target specially-shaped pattern 4 with the same or approximately the same shape and dimensions as the heart shape may be formed on the substrate 7 according to the set shape and dimensions of the heart shape. For example, the display region 5 of the specially-shaped display panel may be provided at a preset position of the substrate 7 according to the set shape and dimensions of the heart shape, and the light-emitting layers are provided in the display region 5. For example, the light-emitting layer includes an OLED device. Then, a bezel region 11 is provided around the display region 5, and the bezel region 11 and the display region 5 constitute a region where the target specially-shaped pattern 4 is located.

The display region 5 may have a shape consistent with the shape of the target specially-shaped pattern 4. For example, the display region 5 may be in a heart shape. Alternatively, the display region 5 has a shape different from the shape of the target specially-shaped pattern 4. For example, the display region 5 may be in an irregular shape other than the heart shape.

For example, the display region 5 may have a size smaller than the size of the target specially-shaped pattern 4.

It will be noted that, the heart shape may be a near heart shape. That is, the shape of the target specially-shaped pattern 4 may be similar to the heart shape, and a curvature of an outline of the heart shape is not limited.

In addition, in some examples, the adhesive coating region 10 may be determined by longest lengths of the target specially-shaped patterns 4 in two directions perpendicular to each other. For example, referring to FIG. 3A, the substrate 7 is in a rectangular shape, and a long side 12 and a short side 13 of the substrate 7 are perpendicular to each other. It is assumed that a longest length of the target specially-shaped pattern 4 along an extension direction of the long side 12 of the substrate 7 is A, and a longest length of the target specially-shaped pattern 4 along an extension direction of the short side 13 of the substrate 7 is B, the shape and dimensions of the adhesive coating region 10 may be determined according to A and B. In this case, according to A and B, the shape of the adhesive coating region 10 may be designed to be a rectangle or a square of certain dimensions that may cover the target specially-shaped pattern 4.

For example, in the case where the adhesive coating region 10 is provided as the square, a side length thereof may be determined according to a larger value of A and B. For example, A is 8 cm and B is 9 cm, and all side lengths of the adhesive coating region 10 may be designed to be greater than or equal to 9 cm, such as 9 cm, 10 cm or 11 cm.

For another example, in the case where the adhesive coating region 10 is provided as the rectangle, the short side and the long side thereof may be determined according to A and B, respectively. For example, A is 8 cm and B is 9 cm, and the short side and the long side of the adhesive coating region 10 may be respectively designed to be greater than or equal to 8 cm and 9 cm, such as 8 cm and 9 cm, 8 cm and 10 cm, or 10 cm and 11 cm.

It will be understood that the above numerical values are used for illustration only, and they are not limited in the embodiments of the present disclosure. The specific dimensions of the adhesive coating region 10 may be differently set according to different situations and needs, as long as the adhesive coating region 10 has the regular shape and covers the target specially-shaped pattern 4.

In some embodiments, as shown in FIG. 3A, the region of the substrate 7 in which the target specially-shaped pattern 4 is formed includes the display region 5 that is in the heart shape and the bezel region 11 that is located around the display region 5. The display region 5 may be provided therein with the OLED devices that are used for light-emitting for display.

In some examples, with continued reference to FIG. 3A, the bezel region 11 includes at least one bonding region 6. Each bonding region 6 may be provided therein with driving signal line(s). The driving signal line(s) may be electrically connected to external control circuit structure(s) (e.g., a circuit board or an integrated circuit chip) through bonding.

Based on this, in some examples of the present disclosure, as shown in FIGS. 4 and 10, S201 includes: defining, on the cover plate 1, adhesive coating region(s) 10 each of which covers a portion of the target specially-shaped pattern 4 except for all the bonding region(s) 6 and has a regular shape. The adhesive coating region 10 may be determined by longest lengths in two directions perpendicular to each other of the portion of the target specially-shaped pattern 4 except for all the bonding region(s) 6, which is similar to a description that the adhesive coating region 10 is determined by the longest lengths of the target specially-shaped patterns 4 in the two directions perpendicular to each other, and the adhesive coating region 10 may be determined only by replacing the target specially-shaped pattern 4 in the above embodiments with the portion of the target specially-shaped pattern 4 except for all the bonding region(s) 6. It will not be repeated here.

Since the bonding region(s) 6 do not need to be coated therein with an adhesive, when the adhesive coating region 10 is defined, the adhesive coating region 10 only needs to be defined as a region covering the portion of the target specially-shaped pattern 4 except all the bonding region(s) 6.

In this way, when the cover plate 1 is bonded to the substrate 7 formed with the target specially-shaped pattern(s) 4, it not only helps to prevent the adhesive from flowing into the bonding region(s) 6, which improves an electrical connection between the driving signal line(s) and the external control circuit structure(s), but also helps to save adhesive materials and further reduce production costs.

It is worth noting that a position, a quantity, etc. of the bonding region(s) 6 may be flexibly provided according to the shape of the target specially-shaped pattern 4. For example, referring to FIG. 3A, the portion of the target specially-shaped pattern 4 except for the bonding region(s) 6 may be set in a heart shape. For another example, referring to FIG. 3B, an overall shape of the target specially-shaped pattern 4 including the bonding region(s) 6 may be set in a heart shape. The position, the quantity, etc. of the bonding region(s) 6 are not limited in the embodiments of the present disclosure.

In some examples of the present disclosure, the adhesive coating region 10 is a regular-shaped region covering the portion of the target specially-shaped pattern 4 except for all the bonding region(s) 6 and having a minimum area. Still in an example of the heart-shaped special shape, with continued reference to FIGS. 3A and 3B, it is assumed that a longest length of the portion of the heart-shaped target specially-shaped pattern 4 except for all the bonding region(s) 6 along an extension direction of the long side 12 of the substrate 7 is C, a longest length of the portion of the heart-shaped target specially-shaped pattern 4 except for all the bonding region(s) 6 along an extension direction of the short side 13 of the substrate 7 is D, then the adhesive coating region 10 may be defined as a rectangle whose side lengths are C and D, and the rectangular region may be served as the adhesive coating region 10 covering the portion of the target specially-shaped pattern 4 except for all the bonding region(s) 6 and having the minimum area.

In this way, it may not only meet requirements for covering the portion of the target specially-shaped pattern 4 except for all the bonding region(s) 6, which is convenient for adhesive coating; but also reduce the adhesive coating region, which is conducive to saving the adhesive. In addition, it may also help to leave a larger space for a subsequent cutting operation.

It will be noted that, the above embodiments are described by taking an example where the rectangular region is served as the adhesive coating region 10, but it does not limit the shape of the adhesive coating region 10, as long as the adhesive coating region 10 covers the target specially-shaped pattern 4 and has the regular shape. In addition, the adhesive coating region having the minimum area and covering the target specially-shaped pattern 4 is also not limited to the rectangular region.

In some embodiments of the present disclosure, for S202, referring to FIG. 10, the first packaging adhesive 30 is coated in the peripheral region of the adhesive coating region 10, so that a frame-shaped first packaging portion 3 is formed; and the second packaging adhesive 20 is filled in the region surrounded by the first packaging portion 3, so that the second packaging portion 2 is formed.

In some examples, the first packaging adhesive may be an adhesive with a relatively high viscosity and a relatively strong water resistance that is served as a dam adhesive for encapsulating. In this way, it helps to form a closed space after the cover plate 1 is bonded to the substrate 7, so as to effectively protect the display panel. The second packaging adhesive may be an adhesive with a relatively low viscosity, a relatively high fluidity and a relatively high light transmittance that is served as a filler adhesive for filling and supporting. The second packaging adhesive is evenly filled in the region defined by the first packaging adhesive, which not only helps to maintain a uniform cell thickness, thereby helping ensure uniformity of the display effect, but also helps to avoid risks such as in-plane film crushing and fragmentation which easily occur during the cutting process, which helps to increase the strength of the display panel, thereby enabling the display panel to effectively cope with changes of external pressure.

Materials of the first packaging adhesive and the second packaging adhesive are not limited in the embodiments of the present disclosure. For example, materials of both the first packaging adhesive and the second packaging adhesive may include epoxy resin and/or polymethacrylic acid, etc. Composition of the materials of the first packaging adhesive and the second packaging adhesive may be the same as or different. In the case where the composition of the materials of the first packaging adhesive and the second packaging adhesive is the same, proportions of the materials of the first packaging adhesive and the second packaging adhesive are different, so that the first packaging adhesive has the relatively high viscosity; and the second packaging adhesive has the relatively low viscosity, the relatively high fluidity and the relatively high light transmittance.

A curing process of each of the first packaging adhesive and the second packaging adhesive may be selected according to a type of a respective one of the first packaging adhesive and the second packaging adhesive. For example, in a case where the first packaging adhesive is an UV curable adhesive, an UV-curing process may be selected. In a case where the first packaging adhesive is a thermal curable adhesive, a thermal curing process may be selected. The curing process of the second packaging adhesive is similar to that of the first packaging adhesive, and details will not be described here. In addition, the first packaging adhesive and the second packaging adhesive may be curable adhesives of the same type. For example, they are UV curable adhesives or thermal curable adhesives. The first packaging adhesive and the second packaging adhesive may also be curable adhesives of different types.

Referring to FIGS. 3A, 4 and 10, in some embodiments of the present disclosure, the cover plate 1 is bonded to the substrate 7 formed with the target specially-shaped pattern(s) 4 such that the display region 5 is within a region where the second packaging portion 2 is located and the bonding region(s) 6 are located outside a region where the first packaging portion 3 is located. In this way, the second packaging adhesive 20 (e.g., the filler adhesive) that is in the display region 5 may be filled sufficiently and uniformly, which helps to maintain a uniform cell thickness and ensure good luminous properties, thereby improving display quality. In addition, the first packaging adhesive 30 (e.g., the dam adhesive) may also effectively prevent the filler adhesive from flowing into the bonding region(s) 6. As a result, it may effectively prevent the filler adhesive from covering the circuit structures that are located in the bonding region(s) 6, which is not conducive to bonding the driving signal line(s).

Figure 6:
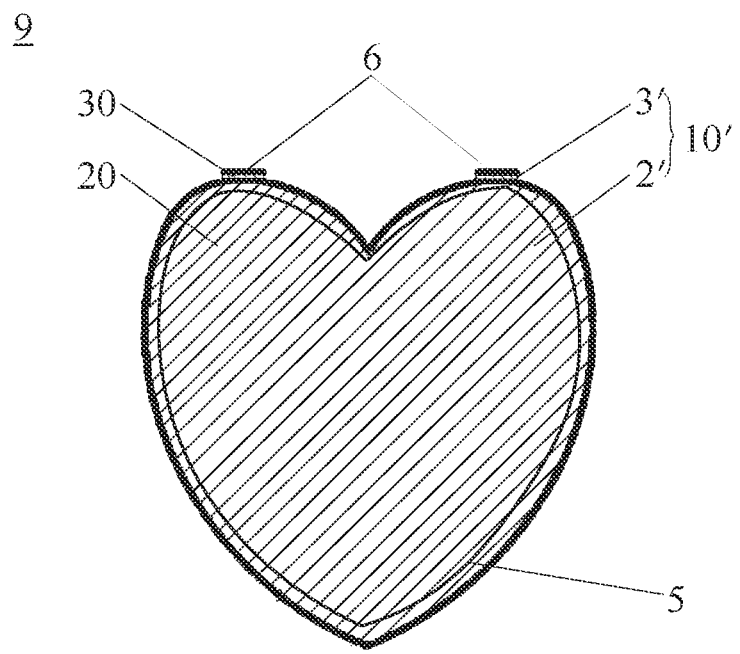
FIG. 6 is a structural diagram of a display panel obtained by cutting a substrate and a cover plate that have been bonded according to a target specially-shaped pattern, in accordance with some embodiments.

Based on this, the substrate 7 and the cover plate 1 that have been bonded are cut according to the target specially-shaped pattern 4, so that the display panel 9 may be obtained through a one-time cutting manner. As shown in FIG. 6, a first adhesive layer 3' is formed from the first packaging portion 3 through the cutting process, and a second adhesive layer 2' is formed from the second packaging portion 2 through the cutting process. The first adhesive layer 3' and the second adhesive layer 2' constitute an adhesive layer 10' of the display panel 9. Since the dam adhesive and portions of the filler adhesive that are outside the target specially-shaped pattern 4 have been removed, a considerable region of the target specially-shaped pattern 4 has no dam adhesive therein, and the dam adhesive is only retained in the bonding region(s) 6, which is more conducive to the realization of narrow bezel display or bezel-less display.

Figure 5:
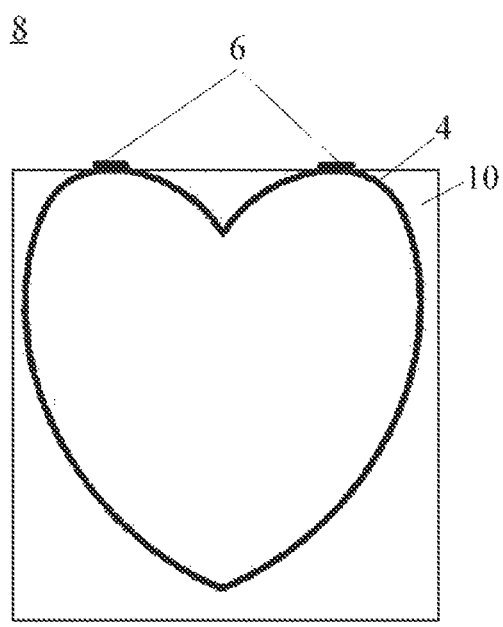
FIG. 5 is a structural diagram of a display panel of a regular shape obtained by cutting a substrate and a cover plate that have been bonded according to a region corresponding to both an adhesive coating region and a target specially-shaped pattern, in accordance with some embodiments.

In some embodiments of the present disclosure, for S205 or S104, the display panel 9 may also be obtained through a twice cutting manner. For example, the substrate 7 and the cover plate 1 that have been bonded may be cut for a first time according to a region corresponding to both the defined adhesive coating region 10 and the target specially-shaped pattern 4, so that a semi-finished display panel 8 having a regular shape as shown in FIG. 5 is formed. Then, portions of the substrate, portions of the packaging adhesive (e.g., portions of the dam adhesive and portions of the filler adhesive) and portions of the cover plate 1 of the semi-finished display panel 8 that are all located outside the target specially-shaped pattern 4 are removed through cutting and/or edge grinding process, so that the display panel 9 as shown in FIG. 6 is obtained. In this way, the substrate 7 and the cover plate 1 that have been bonded may be cut to form the separate and semi-finished display panel 8 with the regular shape, which is convenient for a cutting tool (e.g., a cutting knife) to perform a next cutting operation according to the target specially-shaped pattern 4, which helps to form a streamlined production line, thereby improving production efficiency.

It is worth noting that, whether the display panel 9 is obtained through the one-time cutting manner or the twice cutting manner, in some examples, in addition to portion(s) of the dam adhesive retained in the bonding region(s) 6, other dam adhesive(s) may be retained at other required positions according to needs.

For example, the "other required positions" may include an installation region and/or a decoration region. The installation region may be used for fixing and installation of the display panel. The decoration region may be used for decoration of a periphery of the display panel.

In some embodiments of the present disclosure, for S206, as shown in FIG. 7, the sealant 14 is coated on the edges of the display panel 9, so that the packaging of the display panel 9 is completed. For example, the sealant 14 may be coated in an edge region between a specially-shaped substrate 7' and a specially-shaped cover plate 1' that are formed through cutting for reinforcement and curing, so that the packaged display panel 9 may have relatively high strength and adhesion.

The sealant 14 may be a thermal curable adhesive or an UV curable adhesive, which is not limited in the embodiments of the present disclosure.

Some embodiments of the present disclosure further provide a display panel 9. The display panel 9 may be manufactured by the above packaging method.

In some embodiments of the present disclosure, as shown in FIG. 7, the display panel 9 includes the specially-shaped substrate 7', the specially-shaped cover plate 1' and the adhesive layer 10'. The specially-shaped substrate 7' has the display region 5, and a shape and dimensions of the specially-shaped cover plate 1' are the same or approximately the same as a shape and dimensions of the specially-shaped substrate 7', respectively. The adhesive layer 10' is located between the specially-shaped substrate 7' and the specially-shaped cover plate 1' and covers at least the display region 5. The specially-shaped substrate 7' and the specially-shaped cover plate 1' may be obtained by cutting the substrate 7 and the cover plate 1 according to the above method. The adhesive layer 10' may be formed by cutting the packaging adhesive in the adhesive coating region 10 according to the above method.

The display panel 9 provided in some embodiments of the present disclosure includes the specially-shaped substrate 7', the specially-shaped cover plate 1' and the adhesive layer 10'. The display region 5 is covered by the adhesive layer 10'. That is, the display region 5 may be coated therein with an adhesive uniformly and sufficiently, which helps to ameliorate uneven display caused by uneven adhesive coating. In addition, the uniform adhesive in the display panel 9 may also enable a uniform cell thickness of the display panel 9, thereby avoiding cracks on edges of the substrate and/or the cover plate in the cutting process. As a result, the quality of the display panel is improved.

In some embodiments of the present disclosure, referring to FIGS. 4, 6 and 7, the specially-shaped substrate 7' has at least one bonding region 6 located at side(s) of the display region 5. The adhesive layer 10' includes a first adhesive layer 3' and a second adhesive layer 2'. The first adhesive layer 3' may be formed from the first packaging portion 3 after the cutting is performed according to the above method, and the second adhesive layer 2' may be formed from the second packaging portion 2 after the cutting is performed according to the above method. That is, the first adhesive layer 3' includes at least one portion of a first packaging adhesive 30, and the second adhesive layer 2' includes the second packaging adhesive 20.

The second packaging adhesive covers the display region 5. All the portion(s) of first packaging adhesive are disposed on side(s) of the second packaging adhesive and connected to the second packaging adhesive. A bonding region 6 of the at least one bonding region is located on a side of a portion of the first packaging adhesive away from the second packaging adhesive. For example, the number of the bonding region(s) 6 is equal to the number of the portion(s) of the first packaging adhesive. In this case, the bonding region(s) 6 are in one-to-one correspondence with the portion(s) of the first packaging adhesive.

In some examples, the viscosity of the first packaging adhesive is higher than the viscosity of the second packaging adhesive. For example, the first packaging adhesive may be an adhesive with a relatively high viscosity and a relatively strong water resistance that is served as a dam adhesive for encapsulating. This helps to form a closed space after the cover plate 1' is bonded to the substrate 7', so as to effectively protect the display panel 9. The second packaging adhesive may be an adhesive with a relatively low viscosity, a relatively high fluidity and a relatively high light transmittance that is served as a filler adhesive. The second packaging adhesive is evenly filled inside the display panel 9, which not only helps to ensure the uniformity of the display effect, but also helps to avoid risks such as in-plane film(s) crushing and fragmentation which easily occurs during the cutting process, which helps to increase the strength of the display panel 9, thereby enabling the display panel 9 to effectively cope with changes of external pressures.

In this way, the filler adhesive may be filled sufficiently and uniformly in the display region 5, which helps to maintain a uniform cell thickness and ensure good luminous properties, thereby improving display quality. Moreover, the dam adhesive arranged between the filler adhesive and the bonding region(s) 6 may also effectively prevent the filler adhesive from flowing into the bonding region(s) 6, which prevents the filler adhesive from affecting the circuit structure. In addition; since the dam adhesive and portions of the filler adhesive that are outside the specially-shaped substrate 7' have been removed, a considerable region of the specially-shaped substrate 7' has no dam adhesive therein, and the dam adhesive is only retained in the bonding region(s) 6, which is conducive to the realization of narrow bezel display or bezel-less display.

In some examples, in addition to the dam adhesive retained in the bonding region(s) 6, other dam adhesive(s) may also be retained at other required positions according to needs. For example, the "other required positions" may include an installation region and/or a decoration region, which helps to expand usage scenarios of the display panel 9. For example, the display panel 9 is placed in a shopping mall or some places that need to be noticed, and the display panel 9 may achieve a good effect on catching people's attention due to its shape.

In some embodiments of the present disclosure, referring to FIG. 7, the display panel 9 further includes the sealant 14 coated on the edges of both the specially-shaped substrate 7' and the specially-shaped cover plate 1'. For example, the sealant 14 may be coated in edge regions between the specially-shaped substrate 7' and the specially-shaped cover plate 1', which may reinforce the specially-shaped substrate 7' and the specially-shaped cover plate 1' in a certain degree. In this way, it helps to enable the display panel 9 to maintain relatively high strength and adhesion.

The above structures may be formed through corresponding steps in the method, and a specific forming process may refer to specific descriptions in the method, which will not be repeated here.

Figure 8:
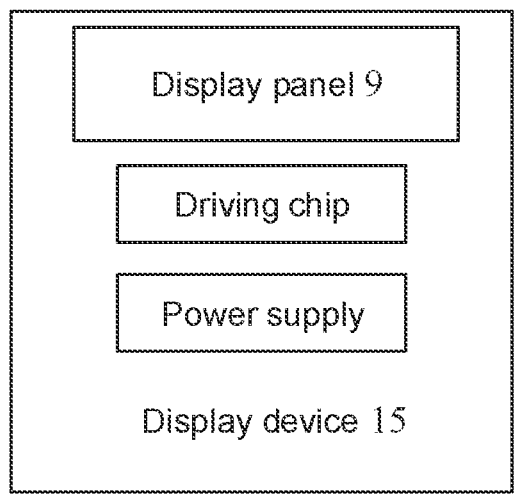
FIG. 8 is a structural diagram of a display apparatus, in accordance with some embodiments.

Some embodiments of the present disclosure further provide a display apparatus 15. As shown in FIG. 8, the display apparatus 15 includes the display panel 9 in the above embodiments, and has beneficial effects of the display panel 9 in the above embodiments. It will not be repeated here.

In some examples, the display apparatus 15 further includes a driving chip and a power supply. The driving chip is configured to drive the display panel 9 for display, and the power supply is configured to provide power to the display panel 9.

It will be noted that, display apparatuses provided in the embodiments of the present disclosure may be any device that displays an image whether in motion (e.g., a video) or stationary (e.g., a still image), and whether textual or graphical. More specifically, the above embodiments may be implemented in or associated with a variety of electronic devices. The electronic devices may include (but not limit to), for example, mobile telephones, wireless devices, portable android devices (PAD), hand-held or portable computers, global positioning system (GPS) receivers/navigators, cameras, MPEG-4 Part 14 (MP4) video players, video cameras, game consoles, watches, clocks, calculators, television (TV) monitors, flat panel displays, computer monitors, car displays (e.g., odometer displays), cockpit controllers and/or displays, camera view displays (e.g., displays of rear view cameras in vehicles), electronic photos, electronic billboards or signs, projectors, architectural structures, packaging and aesthetic structures (e.g., displays for displaying an image of a piece of jewelry).

It will be noted that, although the various steps of the method in the embodiments of the present disclosure are described in a specific order in the accompanying drawings, this does not require or imply that these steps must be performed according to the specific order, or that all of the steps shown must be performed to achieve a desired result. In contrast, the steps depicted in the flow diagrams may change the order of execution. Additionally or alternatively, some steps may be omitted, multiple steps may be combined into one step for execution, and/or one step may be decomposed into multiple steps for execution, etc.

The foregoing descriptions are merely specific implementations of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A packaging method of a specially-shaped display panel, the packaging method comprising:
    defining, on a cover plate, at least one adhesive coating region that each is to cover a respective target specially-shaped pattern and has a regular shape;
    forming a packaging adhesive on the at least one adhesive coating region;
    bonding the cover plate formed with the packaging adhesive with a substrate formed with at least one target specially-shaped pattern, so that a display region of each target specially-shaped pattern is within a respective adhesive coating region; and
    cutting the substrate and the cover plate that have been bonded according to the respective target specially-shaped pattern to obtain the specially-shaped display panel;
    wherein a region of the substrate on which the respective target specially-shaped pattern is formed includes at least one bonding region disposed adjacent to at least one side of the display region, and defining, on the cover plate, the at least one adhesive coating region that each is to cover the respective target specially-shaped pattern and has the regular shape, includes:
    defining, on the cover plate, at least one adhesive coating region that each is to cover a portion of the respective target specially-shaped pattern except for the at least one bonding region and has a regular shape, wherein the portion of the respective target specially-shaped pattern except for the at least one bonding region is in a heart shape.

2. The packaging method according to claim 1, wherein the packaging adhesive includes a first packaging adhesive and a second packaging adhesive, and forming the packaging adhesive on the at least one adhesive coating region, includes:
    coating the first packaging adhesive on a peripheral region of each adhesive coating region to form a closed and regular-shaped first packaging portion; and
    filling the second packaging adhesive on a region surrounded by the first packaging portion to form a second packaging portion, wherein a viscosity of the second packaging adhesive is lower than a viscosity of the first packaging adhesive.

3. The packaging method according to claim 2, wherein coating the first packaging adhesive on the peripheral region of the adhesive coating region to form the closed and regular-shaped first packaging portion, includes:
    coating the first packaging adhesive on the peripheral region of the adhesive coating region to form a frame-shaped first packaging portion.

4. The packaging method according to claim 2, wherein bonding the cover plate formed with the packaging adhesive with the substrate formed with the at least one target specially-shaped pattern, so that the display region of the target specially-shaped pattern is within the respective adhesive coating region, includes:
    bonding the cover plate formed with the packaging adhesive to the substrate formed with the at least one target specially-shaped pattern, so that the display region is located in a region where the second packaging portion is located.

5. The packaging method according to claim 2, wherein bonding the cover plate formed with the packaging adhesive with the substrate formed with the at least one target specially-shaped pattern, so that the display region of the target specially-shaped pattern is within the respective adhesive coating region, includes:
    bonding the cover plate formed with the packaging adhesive with the substrate formed with the at least one target specially-shaped pattern, so that the display region of the target specially-shaped pattern is within the respective adhesive coating region and the at least one bonding region is located adjacent to at least one side of the first packaging adhesive portion away from the second packaging adhesive.

6. The packaging method according to claim 1, wherein defining, on the cover plate, the at least one adhesive coating region that each is to cover the portion of the respective target specially-shaped pattern except for the at least one bonding region and has the regular shape, includes:
    defining, on the cover plate, the at least one adhesive coating region covering the portion of the respective target specially-shaped pattern, except for the at least one bonding region, the at least one adhesive coating region having a rectangular shape and a minimum area.

7. The packaging method according to claim 1, wherein before bonding the cover plate formed with the packaging adhesive with the substrate formed with the at least one target specially-shaped pattern, the packaging method further includes:
    curing the packaging adhesive.

8. The packaging method according to claim 1, wherein cutting the substrate and the cover plate that have been bonded according to the respective target specially-shaped pattern to obtain the specially-shaped display panel, includes:
    cutting the substrate and the cover plate that have been bonded for a first time according to a region corresponding to both the adhesive coating region and the respective target specially-shaped pattern, so as to form a semi-finished display panel having a regular shape; and
    removing portions of the substrate, portions of the packaging adhesive and portions of the cover plate of the semi-finished display panel that are all located outside a region corresponding to the respective target specially-shaped pattern through cutting and/or edge grinding process, so that the specially-shaped display panel is obtained.

9. The packaging method according to claim 1, wherein after cutting the substrate and the cover plate that have been bonded according to the respective target specially-shaped pattern, the packaging method further comprises:
coating a sealant on edges of the specially-shaped display panel to complete packaging of the specially-shaped display panel.

10. A specially-shaped display panel, comprising:
a specially-shaped substrate having a display region and at least one bonding region disposed adjacent to at least one side of the display region;
a specially-shaped cover plate having approximately same shape and dimensions as the specially-shaped substrate, and
an adhesive layer located between the specially-shaped substrate and the specially-shaped cover plate, the adhesive layer covering at least the display region without covering the at least one bonding region, wherein
except all bonding regions, if more than one, a remaining part of the specially-shaped substrate is in a heart shape.

11. The specially-shaped display panel according to claim 10, wherein the adhesive layer includes a second packaging adhesive and at least one portion of a first packaging adhesive; the second packaging adhesive covers the display region, and the at least one portion of the first packaging adhesive is disposed adjacent to at least one side of the second packaging adhesive, a viscosity of the at least one portion of the first packaging adhesive is higher than a viscosity of the second packaging adhesive.

12. The specially-shaped display panel according to claim 11, wherein a bonding region of the at least one bonding region is located adjacent to a side of a portion of the first packaging adhesive away from the second packaging adhesive.

13. The specially-shaped display panel according to claim 12, wherein a number of the at least one bonding region is equal to a number of the at least one portion of the first packaging adhesive.

14. The specially-shaped display panel according to claim 10, further comprising:
a sealant disposed on edges of both the specially-shaped substrate and the specially-shaped cover plate.

15. The specially-shaped display panel according to claim 12, wherein the at least one portion of the first packaging adhesive each is connected to the second packaging adhesive.

16. The specially-shaped display panel according to claim 10, wherein the display region is in a heart shape.

17. A display apparatus, comprising the specially-shaped display panel according to claim 10.

* * * * *